United States Patent
Watanabe et al.

(10) Patent No.: US 6,522,122 B2
(45) Date of Patent: Feb. 18, 2003

(54) JITTER MEASURING DEVICE AND METHOD

(75) Inventors: Toshifumi Watanabe, Tokyo (JP); Akihiko Ando, Tokyo (JP); Yuichi Miyaji, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/774,196

(22) Filed: Jan. 29, 2001

(65) Prior Publication Data

US 2001/0012320 A1 Aug. 9, 2001

(30) Foreign Application Priority Data

Jan. 31, 2000 (JP) .................................... 2000-022069
Sep. 26, 2000 (JP) .................................... 2000-291636

(51) Int. Cl.$^7$ .................. G01R 23/12; H03D 13/00; G06F 19/00
(52) U.S. Cl. ................... 324/76.77; 324/76.52; 702/609
(58) Field of Search .................. 324/76.77, 76.15, 324/76.11, 121 R, 622, 76.21, 76.38, 76.52; 702/69, 66

(56) References Cited

U.S. PATENT DOCUMENTS 3,737,766 A * 6/1973 Lubarsky, Jr. ............. 324/622
5,900,755 A * 5/1999 Toeppen et al. ........ 324/121 R

* cited by examiner

*Primary Examiner*—N. Le
*Assistant Examiner*—James Kerveros
(74) *Attorney, Agent, or Firm*—David N. Lathrop, Esq.; Gallagher & Lathrop

(57) ABSTRACT

A signal to be measured is waveform-formatted to a square waveform that retains the frequency, duty ratio and jitter component of the original signal, and the leading (or trailing) edge of the waveform-formatted output is sampled by a sampling clock of a frequency slightly different from 1/N of the frequency $f_M$ of the signal to be measured. The samples are converted by an A/D converter to digital data $V_n(t)$, which is stored in a memory. The difference between the stored digital data $V_n(t)$ and the rise-up characteristic line V'(t) is calculated to detect jitter $J'_n(t)$.

26 Claims, 12 Drawing Sheets

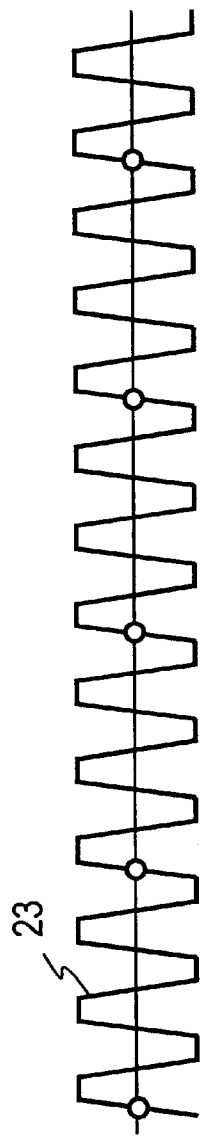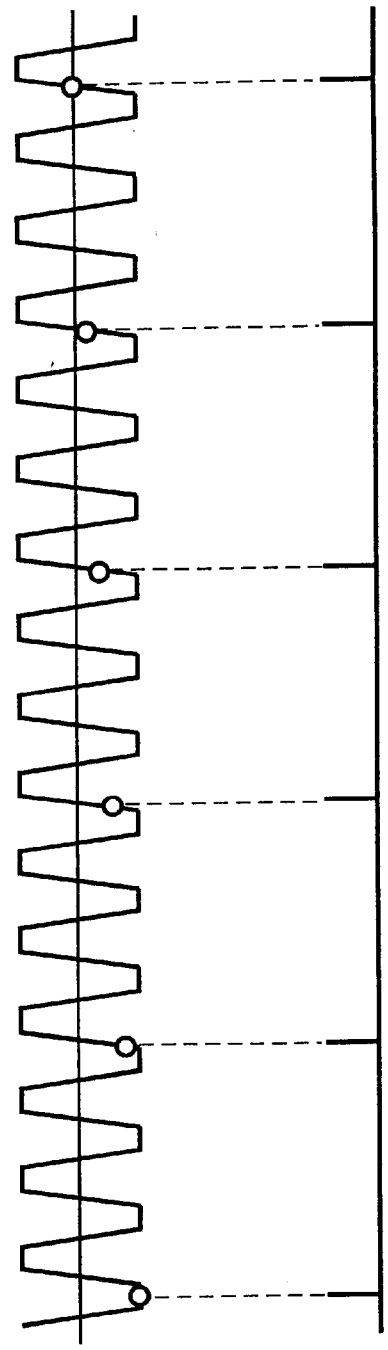
FIG. 3A
FIG. 3B
FIG. 3C
FIG. 3D

FIG. 6
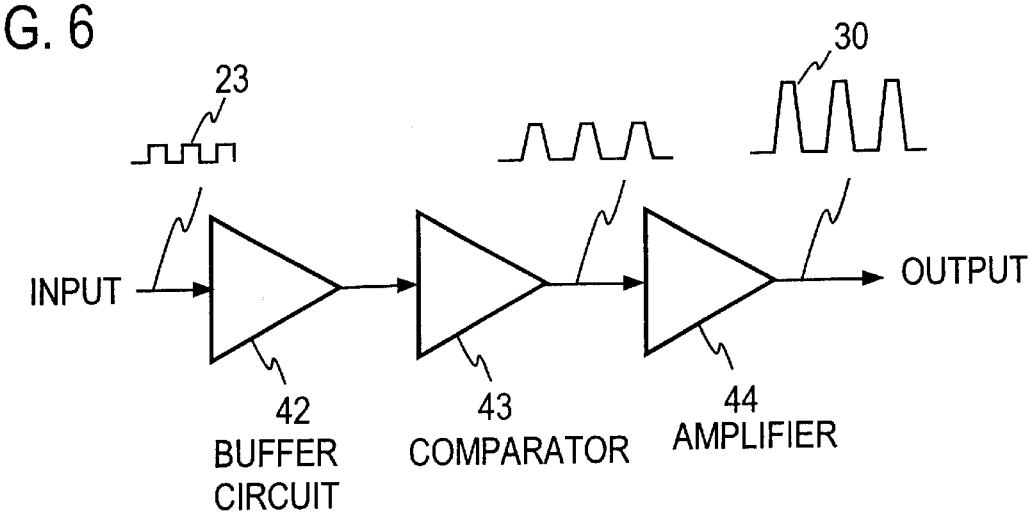
FIG. 7A
FIG. 7B
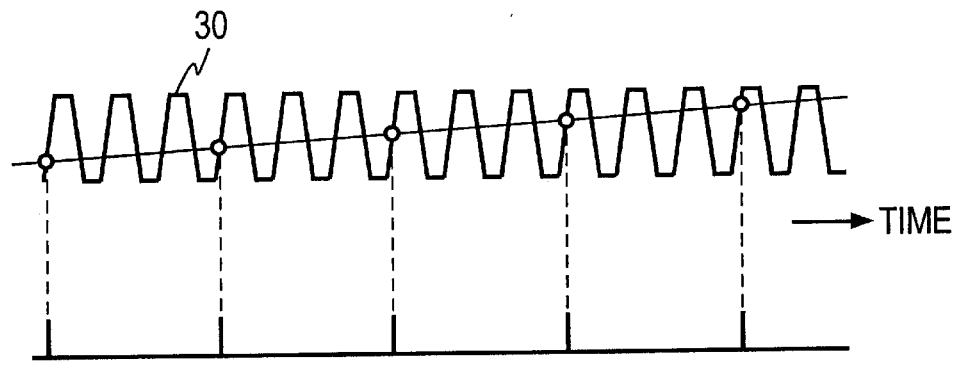
FIG. 8
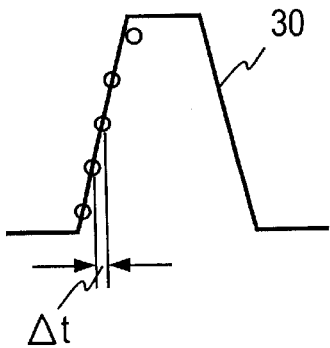

JITTER MEASURING DEVICE AND METHOD

BACKGROUND OF THE INVENTION

The present invention relates to a jitter measuring device and method for measuring on-time-base fluctuations in one or both of the rise and fall of a signal which has a periodic waveform, such as a pulse train in digital transmission or a clock signal that is output from a semiconductor integrated circuit.

For example, pulses in digital transmission are properly arranged on the time base when generated, that is, the pulse train has a waveform that rises and falls in synchronization with a clock of an exact period, but its passage through a regenerative repeater or the like causes fluctuations in the pulse arrangement, that is, pulse jitter. When the amount of jitter is large, noise will increase, leading to improper transmission or malfunction of equipment. Accordingly, it is necessary to measure and take into account the amount of jitter in the case of handling signals of periodic waveforms.

A conventional jitter measuring device is disclosed in Japanese Patent Application Laid-Open Gazette No. 262083/96 entitled "Jitter Measuring Device." In the conventional jitter device, as depicted in FIG. 1, a signal to be measured 23 from a device under measurement 11, such as a regenerative repeater or semiconductor integrated circuit, is provided via an input terminal 12 to a PLL (Phase-Locked Loop) circuit 13 and a sampling circuit 14. In the PLL circuit 13 the oscillation output from a VCO (Voltage-Controlled Oscillator) 15 is frequency-divided by a frequency divider 16 down to 1/N, and the frequency-divided signal is phase-compared by a phase comparator 17 with the signal 23 fed from the input terminal 12. The phase-compared output is added by an added 18 with a phase offset voltage fed from a D/A converter 19, and the added output is provided via a loop filter 21 to a control terminal of VCO 15. The above-mentioned phase offset voltage is adjusted so that the oscillation frequency of VCO 15 becomes N times higher than an average value of the frequency of the signal to be measured 23 and that the phase of the sinusoidal oscillation output from VCO 15 coincides at its substantially zero-crossing point with the rise of the signal 23.

The sinusoidal output from the PLL circuit 13 is applied to a harmonic suppressor filter 22, wherein its higher harmonics are suppressed to form a signal of a pure sinusoidal waveform. This sine-wave signal is applied to the sampling circuit 14, wherein it is sampled by, for instance, the leading edge of the signal to be measured 23, and the output from the sampling circuit 14 is converted by an A/D converter 24 to digital data, which is once stored in a memory 25. When the input signal to be measured 23 has no jitter, the digital data is representative of a sample value of the sinusoidal VCO output at the zero-crossing point thereof. If the input signal to be measured 23 has jitter, the digital data that is stored in the memory 5 will be sample data of the amplitude of the sinusoidal VCO output at a point displaced apart in phase from the zero-crossing point of the VCO output by a value corresponding to the amount of jitter. Letting the VCO output signal be represented by $Y(t)=A \sin(2\pi N f_i t)$ (where $f_i$ is the frequency of the signal to be measured 23), the voltage obtained by sampling the VCO output signal $Y(t)$ can be expressed by $v(t_a)=A \sin(2\pi N f_i \cdot T_j(t_n))$ (where $n=0, 1, 2, \ldots$), and $T_j(t_n)$ is data indicating the jitter and can be calculated by $T_j(t_n)=(1/2\pi N f_i)\sin^{-1}(v(t_n)/A)$. This calculation is conducted in a calculation part 26, and the data $T_j(t_n)$ is displayed intact or its square mean value $T_{jrms}$ is displayed as an effective value in a display part 27. It is also possible, in this case, to calculate and display a square mean value $T_{jrms}=\sqrt{(\Sigma(t_j(t_i)-T_{jm}))^2}$ that is the difference between a mean value $T_{jm}$ of $T_j(t_n)$ over a certain period of time and $T_j(t_n)$.

The fabrication of the conventional jitter measuring device is troublesome because it is necessary that the PLL circuit 13 and the harmonic suppression filter 22 for stably generating the sine-wave signal at an average frequency of the signal to be measured 23 be designed and fabricated for each different signal to be measured. For high-accuracy measurement, the phase of the sinusoidal VCO output needs to be adjusted by a phase offset voltage from the D/A converter 19 so that the VCO output is sampled at its zero-crossing point when the signal 23 has no jitter—this phase adjustment is difficult to make.

In view of the above, it is possible to use a jitter measuring device depicted in FIG. 2. A reference signal of an exact period is applied from a reference signal generator 31 to the device under measurement 11, from which a jitter-affected, square-wave signal to be measured 23, which has an average frequency equal to the frequency of the reference signal, is applied to a sampling circuit 14. The reference signal is applied as well to a signal generator 32, which generates a sampling clock that has a frequency equal to 1/N of an average frequency of the signal to be measured 23 and coincides with the midpoint or zero-crossing point of the leading or trailing edge of a signal corresponding to the average frequency of the square-wave signal to be measured 23. The sampling clock is used to sample the signal 23 by the sampling circuit 14. That is, as indicated by the white circles in FIG. 3A, the square-wave signal to be measured 23 is sampled, for example, in the vicinity of the zero-crossing point of its leading edge by the sampling clock depicted in FIG. 3B as indicated by the white circles in FIG. 3A.

In order that the signal to be measured 23 and the sampling clock may bear such a phase relationship, the following processing is carried out. That is, the output frequency of the signal generator 32 is set at a value such that the N-fold value of the frequency of the sampling clock slightly differs from the average frequency of the signal to be measured 23. By this setting, the sampling point of the signal 23 by the sampling clock gradually shifts; for example, while the low-level portion of the square-wave signal 23 is sampled, the level of the output sample from the sampling circuit 14 has a large negative value, but when the phase of sampling the signal 23 by the sampling clock gradually lags and then the sampling point reaches the leading edge of the square-wave signal 23 as indicated by the while circles in FIG. 3C, the level of the output sample gradually approaches zero. When the point in time the level of the output sample becomes zero is detected by a phase detector 33, the detected output is provided to the signal generator 32. In response to the input thereto, the signal generator 32 sets its output frequency such that it generates a sample clock that retains the phase of sampling at that point in time and has a frequency equal to 1/N of the average frequency of the signal to be measured 23.

Further, the output from the phase detector 33 at that time is applied to the sampling clock control circuit 34 to control it to permit the passage therethrough of the sampling clock from the signal generator 32 to the A/D converter 24. As a result, the A/D converter 24 starts, at this point in time, the conversion of the output sample from the sampling circuit 14 to digital data corresponding to its level for each sampling clock. The thus converted digital data is stored in the memory 25.

Upon completion of the required digital data, the amount of jitter is calculated for each piece of digital data. That is, when the sampling point displaced from the ideal zero-crossing point of the waveform of the signal 23 by $J_i$ and the digital data of that sample is $V_i$ as depicted in FIG. 4, the amount of jitter $j_i$ can be calculated by $J_i = V_i/\tan \alpha$ since $V_i$ and $J_i$ bear a relationship $\tan \alpha = V_i/J_i$ to the gradient $\alpha$ of the leading edge of the signal to be measured 23. This calculation is conducted in a calculation part 35, and the calculated result is displayed in the display part 27. As is the case with the example described previously, a jitter mean value $J_m$ or its square mean value $J_{rms}$ over a predetermined period, or a square mean value of the difference between $J_m$ and $J_i$ may be displayed in the display part 27. Incidentally, the gradient $\alpha$ is precalculated.

The jitter measuring device depicted in FIG. 2 allows using, as the signal generator 32, a commercially available synthesized signal generator and does not necessitate designing and assembling of the PLL circuit and the harmonic suppressor filter for each different signal to be measured, and hence the jitter measuring device is easy to fabricate.

Since the gradient of he leading (or trailing) edge of the waveform of the signal to be measured 23 differs for each different signal to be measured, the gradient $\alpha$ needs to be calculated for each jitter measurement—this is very troublesome.

Since the phase detector 33 does not operate unless the voltage of the input signal thereto has a potential difference variation above a certain valaue, it is difficult to detect the zero-crossing point with high accuracy. Further, when the amplitude of the signal to be measured is small, the phase detector 33 cannot be actuated.

SUMMARY OF THE INVENTION

It is therefore an object of the present invention to provide a jitter measuring device and method that are relatively easy to configure and permit measuring jitter irrespective of the frequency of the signal to be measured and avoid the cumbersome operation of calculating the gradient of the leading (or trailing) edge for each signal to be measured.

According to the present invention, the signal to be measured that is a signal of a periodic waveform is waveform-formatted by a waveform formatter to a square-wave signal that has its leading or trailing edge determined by the characteristic of the waveform formatter and retains the frequency, duty ratio and jitter component of the signal to be measured, and this waveform-formatted signal is sampled by a sampling clock. Jitter is detected by a jitter detector from a sequence of outputs by sampling the leading or trailing edge of the waveform-formatted signal to be measured and a rise-up or fall characteristic of the waveform formatter.

That is, the leading (or trailing) edge of the waveform-formatted output is sampled by a sampling pulse of a frequency slightly different from 1/N (where N is an integer equal to or greater than 1) of the average frequency of the signal to be measured, and a sequence of the sample value is arranged on the leading (or trailing) edge of the waveform-formatted output with the time base compressed down to 1/N. If no jitter is contained in the signal to be measured, the sample value sequence is aligned on the leading (or trailing) edge of the waveform-formatted output, whereas when jitter is contained in the signal to be measured, the sample value sequence deviated from the leading (or trailing) edge. Hence, the jitter can be detected from the deviation of the sample value sequence.

Moreover, by sampling the leading (or trailing) edge of the waveform-formatted output by a sampling pulse of a frequency equal to 1/N (where N is an integer equal to or greater than 1) of the average frequency of the signal to be measured, the sample value always remains unchanged if the ignal to be measured contains no jitter, but if it contains jitter, the sample value changes. The jitter can be calculated from the difference between the sample values and the gradient of the leading (or trailing) edge of the waveform-formatted output.

In any case, the leading (or trailing) edge of the waveform-formatted output remains unchanged even I the signal to be measured differs, and hence the rise-up or fall characteristic of the waveform-formatted output need not be measured for each different signal to be measured.

BRIEF DESCRIPTION OF THE DRAWINGS

FIG. 3A is a diagram showing a signal to be measured and its sampling points;

FIG. 3B is a diagram showing a sampling clock;

FIGS. 3C and 3D are diagrams showing variations of the sampling point of the signal to be measured, by the sampling clock of a frequency slightly different from an integral fraction of the frequency of the signal to be measured;

FIG. 6 is a block diagram depicting a concrete example of a waveform formatter 41 in FIG. 5;

FIG. 7A is a diagram showing a waveform-formatted output 30 and its sampling point FIG. 7B is a diagram showing the sampling clock;

FIG. 8 is a diagram showing the state in which the time base of a sample value sequence is compressed in terms of $\Delta t$;

DETAILED DESCRIPTION OF THE PREFERRED EMBODIMENTS

Figure 1:
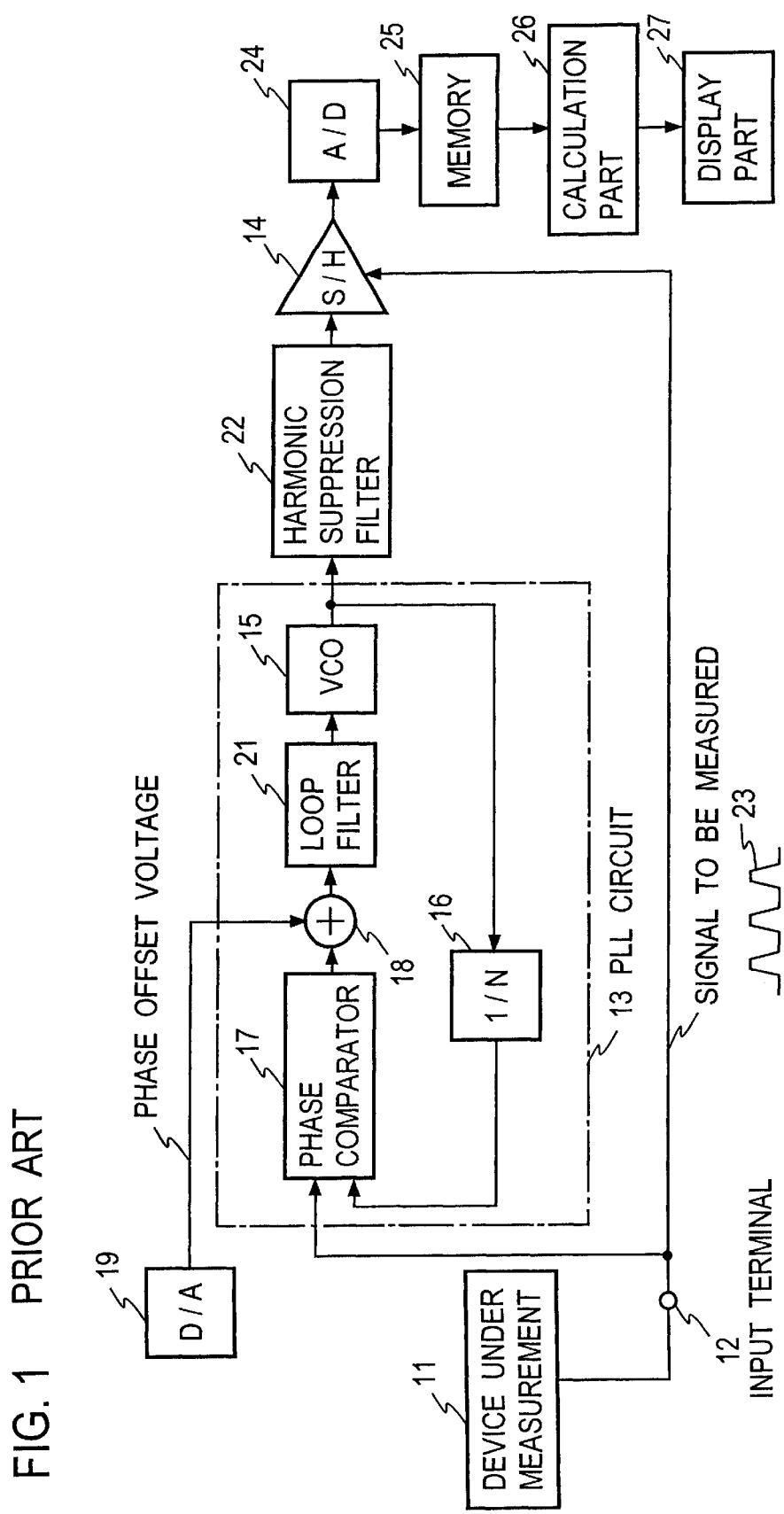
FIG. 1 is a block diagram depicting a conventional jitter measuring device.
Figure 2:
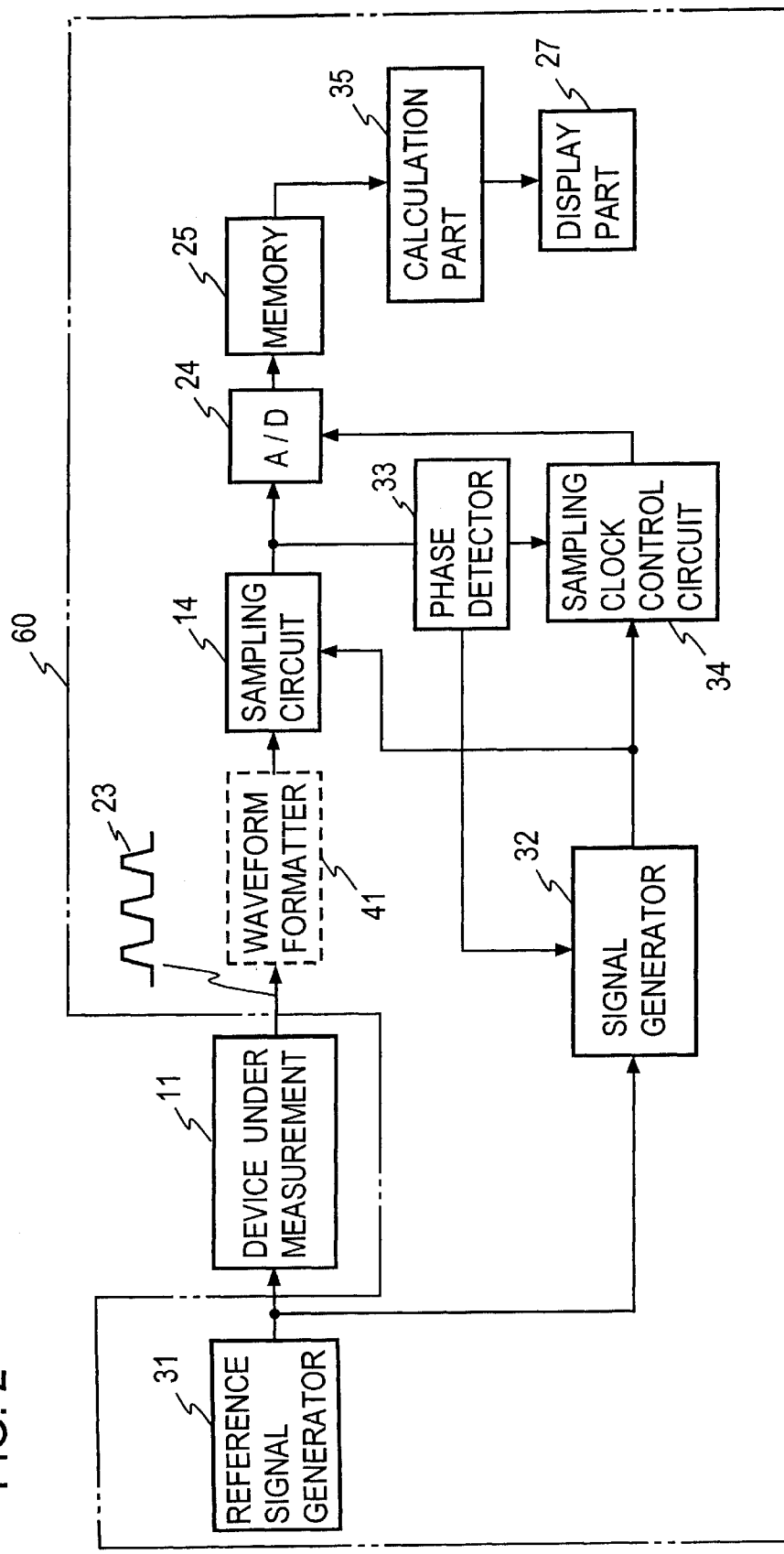
FIG. 2 is block diagram illustrating the functional configuration of an embodiment of the present invention, together with the functional configuration of a proposed jitter measuring device.
Figure 5:
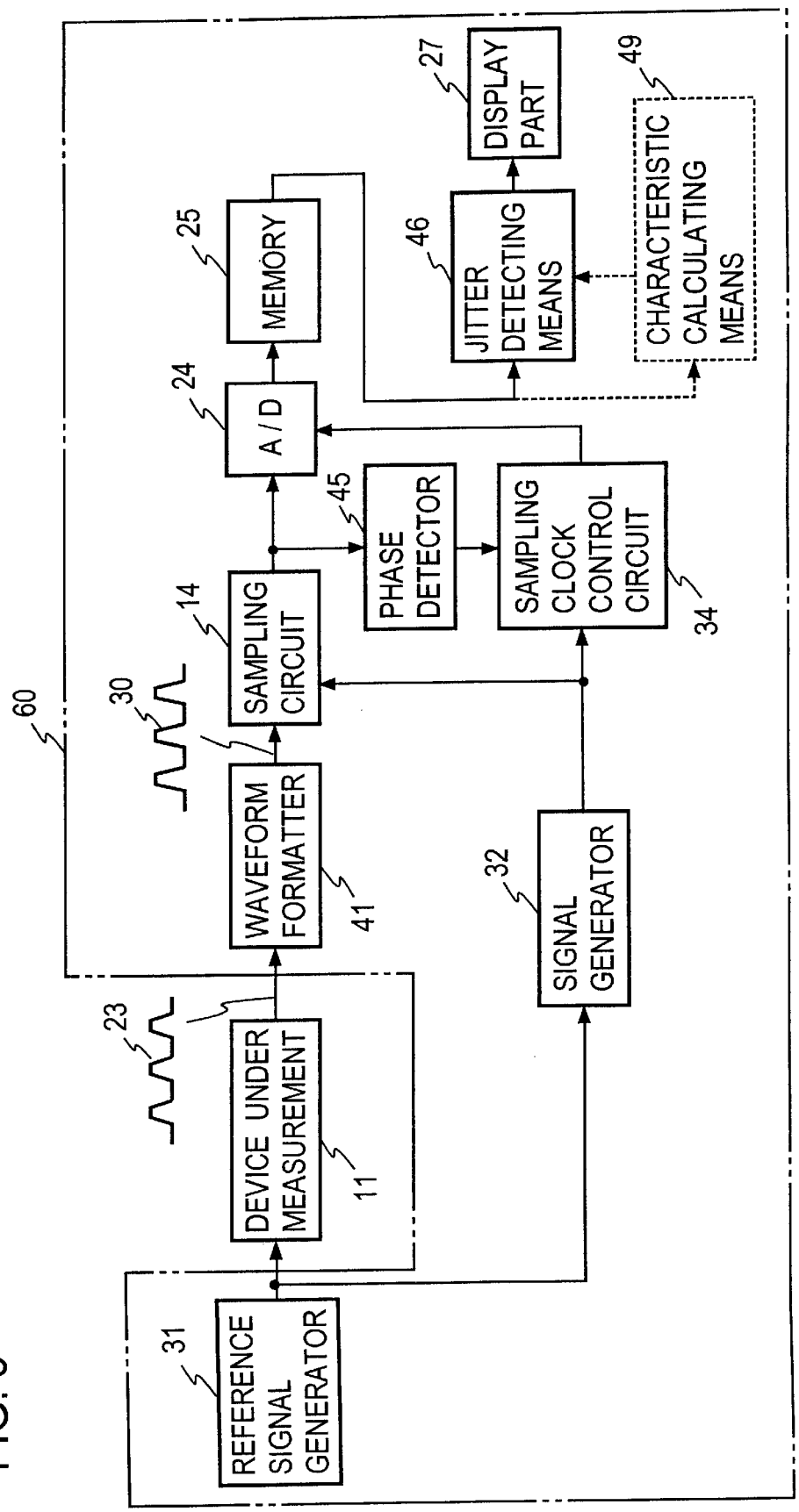
FIG. 5 is a block diagram illustrating the functional configuration of another embodiment of the present invention.

FIG. 5 illustrates in block form an embodiment of the present invention, in which the parts corresponding to those in FIG. 2 are identified by the same reference numerals. In the present invention the signal 23 of a periodic waveform from the device under measurement 11 is applied to the waveform formatter 41, wherein it is waveform-formatted into a square wave that has fixed rise and fall characteristics while retaining the frequency, duty ratio and jitter component of the input signal 23.

The waveform formatter 41 comprises, for example, a buffer circuit 42, a comparator 43 and an amplifier 44 as depicted in FIG. 6. The signal to be measured 23 is input to the buffer circuit 42, then its output is compared by the comparator 43 with its internal reference voltage level and waveform-formatted accordingly, and the output from the comparator 43 is amplified by the amplifier 44 up to a required amplitude for output. The buffer circuit 42 is a circuit that transfers the input signal 23 to the comparator 43 without changing its frequency, duty ratio and jitter component, supplies the comparator 43 with a signal necessary to drive it and suppresses electric interference (that has an adverse influence on the signal to be measured, for instance) between the comparator 43 and the circuit under measurement 11; if these operations are not required, then the buffer circuit 42 can be dispensed with.

The comparator 43 is a circuit that changes its output value only when the input voltage level crosses the reference voltage level. Accordingly, the comparator 43 outputs a fixed high- or low-level voltage, depending on whether the input voltage changes from a low to a high voltage value across the reference voltage level or vice versa. In this instance, the rise time (characteristic) and the fall time (characteristic) of the waveform-formatted output depend on the switching characteristic of the comparator 43 and take fixed value. Accordingly, the output from the comparator 43 is constant in the amplitude value and in the rise time and fall time as well. Furthermore, since the operating point of the comparator 43 is at the reference voltage level, the frequency, duty ratio and jitter component of the input signal 23 are retained in the comparator output.

The amplifier 44 amplifies the input signal by a fixed amplification factor, and the amplified output keeps the frequency, duty ratio and jitter component of the input signal unchanged. When the amplitude value of the output from the comparator 43 is sufficiently large, the amplifier 44 need not be used.

The waveform-formatted output 30 from the waveform formatter 41 is applied to the sampling circuit 14, wherein it is sampled by the sampling clock from the signal generator 32. The frequency $f_C$ of the sampling clock is set at a value slightly different from 1/N (where N is an integer equal to or greater than 1) of the frequency $f_M$ of the signal to be measured 23, that is, at $f_C \approx f_M/N$ The signal generator 32 may be a commercially available desired synthesized signal generator as referred to previously in respect of FIG. 2. To allow ease in building the frequency and phase relationships between the formatted output 30 from the waveform formatter 41 and the sampling clock, it is recommended to use the reference signal from the reference signal generator 31 to control the device under measurement 11 and the signal generator 32 in synchronization with each other.

The output from the sampling circuit 14 is applied to the A/D converter 24 and a phase detector 45. The phase detector 45 detects from the level of the input sample the state of sampling the leading (trailing) edge of the waveform-formatted output 30. That is, the sampling point of the waveform-formatted output 30 gradually shifts on the waveform of the latter because of the afore-mentioned slight frequency difference. During sampling of the low-level portion of the formatted output 30 the sampling level is equal to the low level, and then, for example, when the leading edge of the output 30 is sampled, the sampling level is higher than the low level, indicating the state of sampling the leading edge of the formatted output 30.

Upon detecting the state of sampling the leading or trailing edge of the waveform-formatted output 30, the phase detector 45 provides the detected output to the sampling clock control circuit 34 to control it to permit the passage therethrough of the sampling clock from the signal generator 32 to the A/D converter 24, which starts the conversion of each output sample from the sampling circuit 14 to digital data. These pieces of digital data thus converted are stored in the memory 25 one after another. That is, this embodiment does not involve such a troublesome operation of frequency-converting the sampling clock from the signal generator 32 to $f_M/N = f_C$ while keeping its phase unchanged when the phase detector 33 detects the zero-crossing point of the output sample as referred to previously with reference to FIG. 2. In other words, this embodiment performs the conversion of the output samples from the sampling circuit 14 to digital data and its storage in the memory 25 while maintaining $f_C \approx f_M/N$.

For example, in the case where the waveform-formatted output 30 from the waveform formatter 41 has such a waveform as depicted in FIG. 7A and the sampling clock from the signal generator 32 is such as depicted in FIG. 7B, the state of sampling the leading edge of the waveform-formatted output 30 as indicated by the white circles is detected by the phase detector 45, and the sampling output (sample) of the leading edge of the formatted output 30 is converted by the A/D converter 24 to digital form. Since the frequency $f_C$ of the sampling clock is chosen to be slightly different from $f_M/N$, the sampling point gradually shifts on the leading edge of the waveform-formatted output 30 as indicated by the white circles. In the illustrated example, the sampling frequency $f_C$ is chosen to be slightly lower than 1/3 of the frequency $f_M$ of the signal to be measured 23, and the sampling point shifts upwards on the leading edge of the waveform-formatted output 30 for each sampling. This is equivalent to sampling the waveform-formatted output 30 of the signal 23 at time intervals of $\Delta t = (N/f_M) - (1/f_C)$ that is the difference between $1/f_C$ and $N/f_M$ as shown in FIG. 8.

The difference between $f_M/N$ and $f_C$, and the value N are so chosen as to obtain a required number P of samples for sufficient jitter observation in the sampling of the leading edge of the waveform-formatted output 30. As long as the required number P of samples is obtained, the sampling may be limited to an arbitrary range on the leading edge of the waveform-formatted output 30 and need not be synchronized to the zero crossing of the average waveform-formatted output 30 as described below. Incidentally, under the control of the phase detector 45 the sampling may be carried out over the entire length of the leading or trailing edge of the waveform-formatted output 30, or may be started at an arbitrary position on the leading or trailing edge and stopped after being repeated the predetermined number P of times (for example, ten to several times).

Figure 9A:
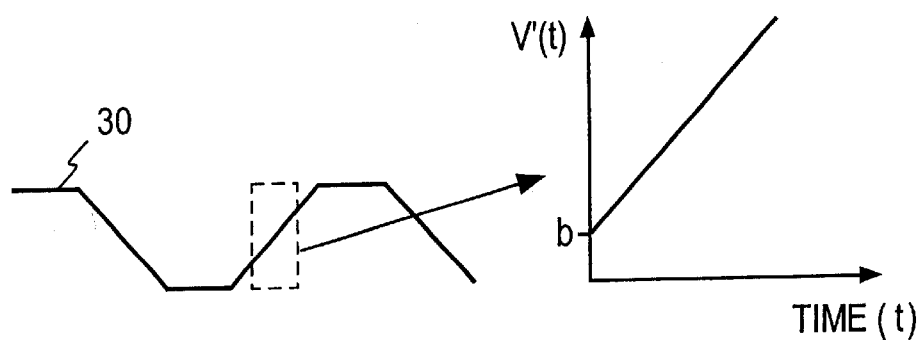
FIG. 9A is a diagram showing an example of a rise-up characteristic V'(t) of the waveform-formatted output 30.

When plural pieces of digital data of the predetermined number P or more samples are thus stored in the memory 25, a deviation of the digital data of each sample from the rising (or falling) characteristic of the waveform formatter 41, which corresponds to the rise (or fall) of the sampled data, is detected by jitter detecting means 46. A characteristic that represents variations in a voltage value V'(t) with the rise time of the waveform-formatted output 30 is constant as depicted in FIG. 9A, for instance, and ideally it is a linear function (a straight line), that is, a function V'(t)=at+b with a constant gradient a and an initial voltage b. Accordingly, if the input signal to be measured 23 does not ever contain jitter, then the waveform-formatted output 30 contains no jitter, either, and the sample values $V(t_n)$ (where n=0, 1, 2, . . . ) indicated by the white circles in FIG. 7A lie on the rising characteristic V'(t) of the waveform-formatted output 30 from the formatter 41. And the sample points are aligned on the leading edge of the waveform-formatted output 30 as shown in FIG. 8 in which the time base is compressed in terms of αt. If the signal to be measured 23 contains jitter, however, the waveform-formatted output 30 also contains the same jitter, and the sample values $V(t_n)$ become larger or smaller according to the jitter than those obtained in the absence of jitter. That is, the sample values $V(t_n)$ deviate from the rise-up characteristic V'(t) of the waveform-formatted output 30, and the sequence of sample values $V(t_n)$ changes with time (t), for example, as depicted in FIG. 9B in which the abscissa represents time in terms of Δt.

Figure 9B:
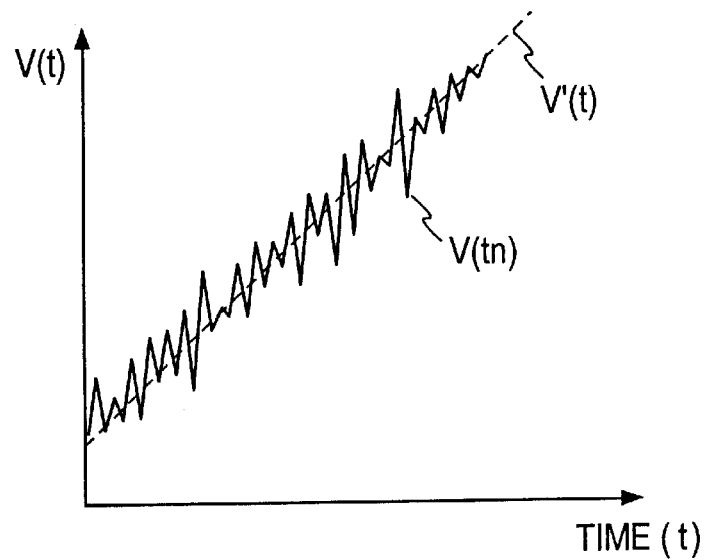
FIG. 9B is a gram showing a sequence of samples $V(t_n)$ on the leading edge on the time base compressed in terms of $\Delta(t)$.
Figure 9C:
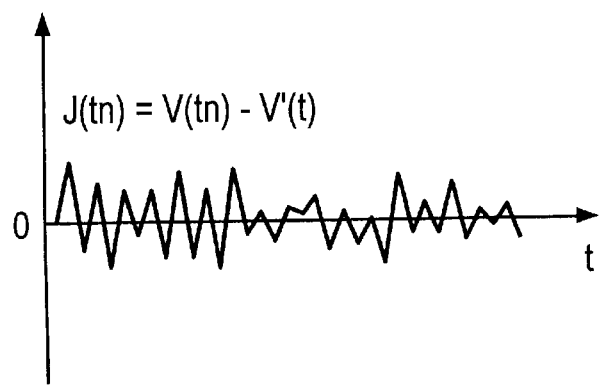
FIG. 9C is a graph showing an example of a detected jitter sequence $J(t_n)$.

Accordingly, subtracting from the digital data $V(t_n)$ of each sample in FIG. 9B the value of the rise-up characteristic V'(t) at the corresponding time gives a jitter value $J'(t_n)=V(t_n)-V'(t)=V(t_n)-at-b$. The value t is one that is set at zero at the start of the inputting to the A/D converter 24 and is incremented by +Δt upon each sampling. The thus obtained jitter value $J'(t_n)$ is such as depicted in FIG. 9C. The jitter value $J'(t_n)$ is displayed in the display part 27. In this instance, too, a fixed offset value is added to the sampled data value according to the sampling start position. That is, there may sometimes be present a time lag between t of $V(t_n)$ and V'(t). Hence it is preferable to calcuate a mean value $J_m$ of P jitter values $J'(t_n)$ and display, as the jitter value, $J(t_n)=J'(t_n)-J_m$ that is a value obtained by subtracting the mean value $J_m$ from each jitter value $J'(t_n)$. Alternatively, a square mean value (effective value) of the jitter value may be calculated and displayed as is the case with the prior art.

Incidentally, the rise-up characteristic V'(t) (=at+b) is precalculated, but its approximate characteristic need only to be precalculated. For example, a signal of a frequency close to that of the signal to be measured 23 and with the smallest possible amount of jitter is applied to the waveform formatter 42, then the leading (or trailing) edge of the formatter output is sampled, then the sampled values are converted to individual pieces of digital data, and the characteristic approximate to V'(t) (=at+b) is calculated by the least square method from the pieces of digital data.

The gradient a of the leading (or trailing) edge of the output 30 from the waveform formatter 41 depends on the switching characteristic of the comparator 43. The gradient a needs only to be precalculated and need not be measured for each signal to be measured. The amount of jitter could be detected with high accuracy by using a comparator of a steep switching characteristic, that is, a comparator that provides a waveform-formatted output of a steep leading (or trailing) edge.

Figure 10C:
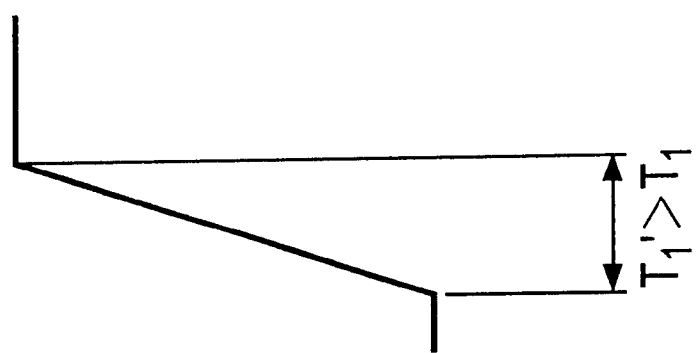
FIG. 10C is a graph showing an example in which the rise-up characteristic of the waveform-formatted output is made dull by an amplifier.
Figure 10B:
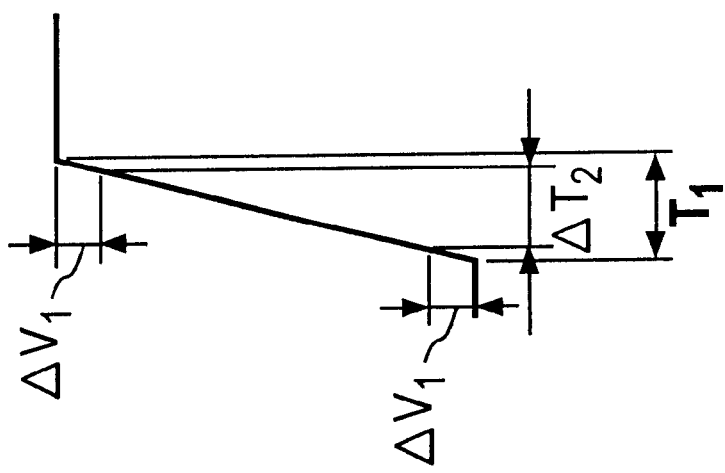
FIG. 10B is a graph showing the jitter measurement range of the waveform-formatted output 30 of a large amplitude.
Figure 10A:
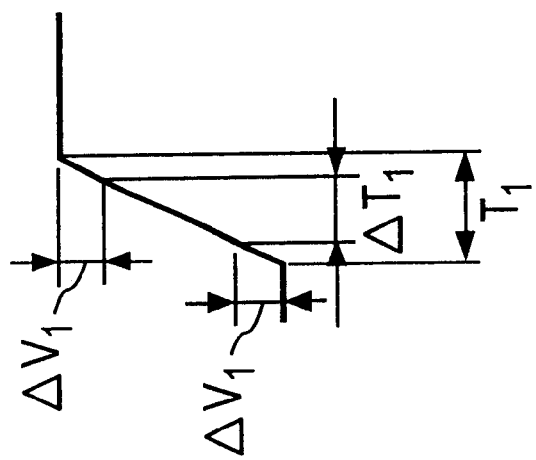
FIG. 10A is a graph showing the jitter measurement range of the waveform-formatted output 30 of a small amplitude.

The phase detector 45 cannot perform its detecting operation unless variations in the input level thereto exceed a certain value. Accordingly, when the amplitude of the signal to be measured 23 is small, it cannot be detected whether the input to the phase detector 45 is the leading or trailing edge of the waveform-formatted output 30, and no jitter can be measured. But this problem can be settled by the use of the amplifier 44 to amplify the amplitude of the waveform-formatted output 30 from the comparator 43. Furthermore, in the case of reading in the phase detector 45 the sample values, for example, from the start to the end of the leading edge of the formatted output 30, letting $\Delta V_1$ represent the level difference detectable by the phase detector 45, the range over which jitter can be detected is $\Delta T_1$ as depicted in FIG. 10A when the amplitude of the signal to be measured 23 is small and the waveform-formatted output 30 also has a small amplitude. However, when the the waveform-formatted output 30 is amplified by the amplifier 44 to be large in amplitude as depicted in FIG. 10B, the range of detectable jitter becomes $\Delta T_2$ wider than $\Delta T_1$ permitting detection of the larger amount of jitter. When the frequency characteristic of the amplifier 44 is not sufficiently wide, the rise-up characteristic becomes dull, that is, less steep as depicted in FIG. 10C, further increasing the amount of jitter that can be detected. In this instance, however, the rise-up characteristic (gradient) of the output from the amplifier 44 needs to be precalculated, and this rise-up characteristic is used as V'(t).

Figure 11:
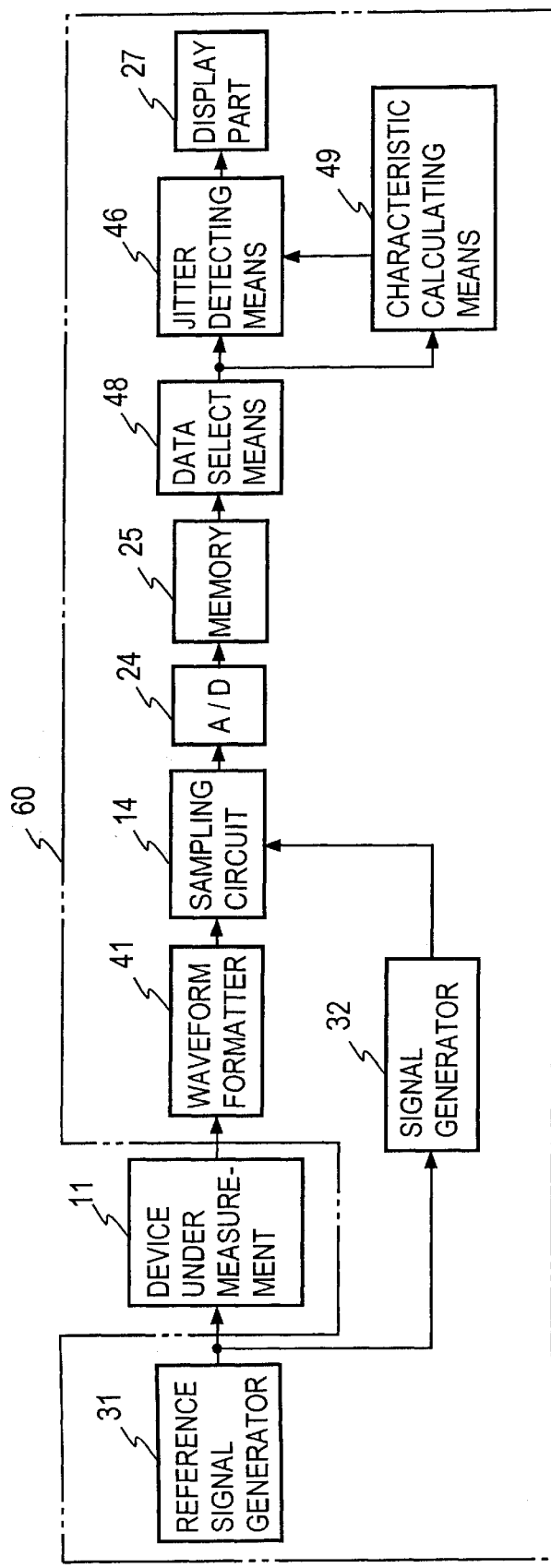
FIG. 11 is a block diagram illustrating the functional configuration of another embodiment of the present invention.

While in the above the leading or trailing edge of the waveform-formatted output 30 is detected by the phase detector 45 and the samples from the sampling circuit 14 are provided to the A/D converter 24, it is also possible to provide all the samples from the sampling circuit 14 to the A/D converter 24, wherein the leading or trailing edge is detected from the input digital data. The circuit arrangement in this case is shown in FIG. 11, in which the parts corresponding to those in FIG. 5 are identified by the same reference numerals. The sampling clock control circuit 34 and the phase detector 445 in FIG. 5 are omitted, and all the samples obtained by the sampling circuit 14 are converted by the A/D converter 24 to digital form and stored in the memory 25.

Figure 12:
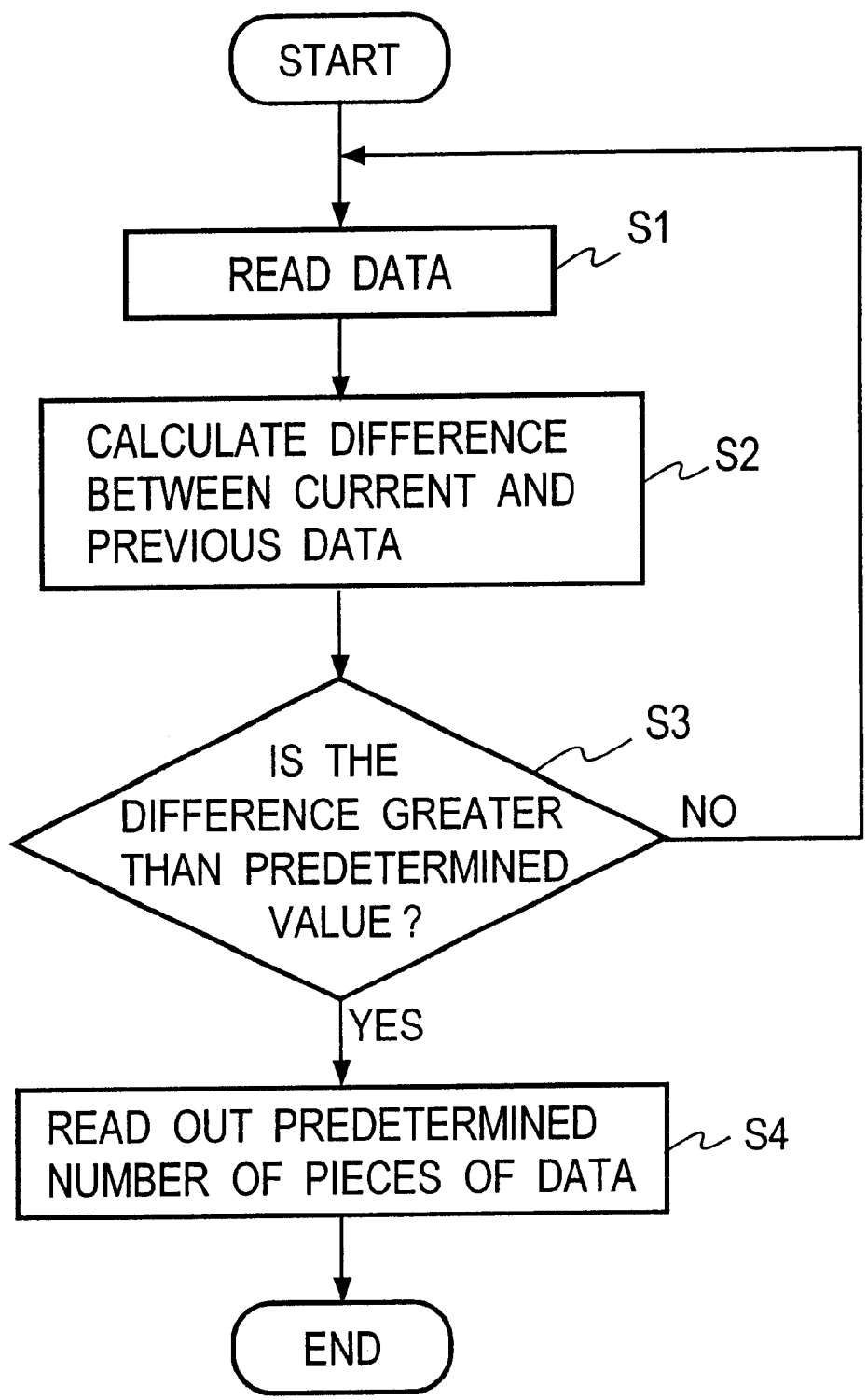
FIG. 12 is a flowchart showing an example of the procedure of data select means 48 in FIG. 11.

The pieces of digital data stored in the memory 25 are sequentially read out therefrom and provided to data select means 48, which select digital data of the leading or trailing edge of the waveform-formatted output 30. This selection follows such a procedure as depicted in FIG. 12. The data select means first reads therein the pieces of digital data from the memory 25 one by one in the order of storage (S1), then calculates the difference between the current and previous pieces of digital data (S2), and makes a check to see if the difference is larger than a predetermined value (S3). For the first piece of digital data input to the data select means 48, however, the difference exceeds the predetermined value because of the absence of the preceding data, and hence is ignored. When the above-mentioned difference is not larger than the predetermined value, the data select means 48 returns to step S1 and reads therein the next piece of digital data. The data to be input next may be one that was stored immediately after the previous data, or one that was stored after a predetermined number of pieces of digital data. The pieces of digital data need not always be input one by one in the order of storage, but a predetermined number of pieces of digital data may be input at one time, in which case a mean value of the input pieces of digital data is calculated and the difference between the mean values of the current and immediately preceding input plural pieces of data is calculated. When it is found in step S3 that the difference is larger than the predetermined value, it is decided that the currently input digital data is one that has reached the leading edge of the waveform-formatted output 30 from the low-level portion thereof or the trailing edge from the high-level portion, and the predetermined number P of pieces of digital data, including the current one, sequentially stored in the memory 25, is read out thereof by the data select means 48 and input to jitter detecting means 46. Alternatively, the decision that the current piece of digital data has reached the leading or trailing edge of the waveform-formatted output 30 is indicated to the jitter detecting means 46, which reads out of the memory 25 a predetermined number of pieces of digital data immediately following the currently input data.

The processing by the jitter detecting means 46 is the same as described previously with reference to the FIG. 5 embodiment. In this instance, a precalculated version of the rise-up (fall) characteristic V'(t) of the waveform-formatted output 30 may be used, and if the precalculated value is not prepared, the characteristic is calculated by characteristic calculating means 49 from the pieces of digital data selected by the data select means 48 and is used in the jitter detecting means 46. The characteristic calculating means 49 uses the input pieces of data to calculate an approximate line close to them as by the least square mean method, and uses the approximate line as the characteristic V'(t). For the same kind of signals to be measured, the approximate line V'(t) needs only to be calculated once. Furthermore, in this case, jitter can be detected with accuracy even if the rise-up or fall characteristic of the waveform-formatted output 30 deviates from the straight line due to the characteristic of the comparator 43 itself or the passage of the comparator output through the amplifier 44 and even if the rise-up or fall characteristic varies with time or due to changes in the environment. The use of the approximate line by the characteristic calculating means 49 is applicable as well to the FIG. 5 embodiment.

Figure 13:
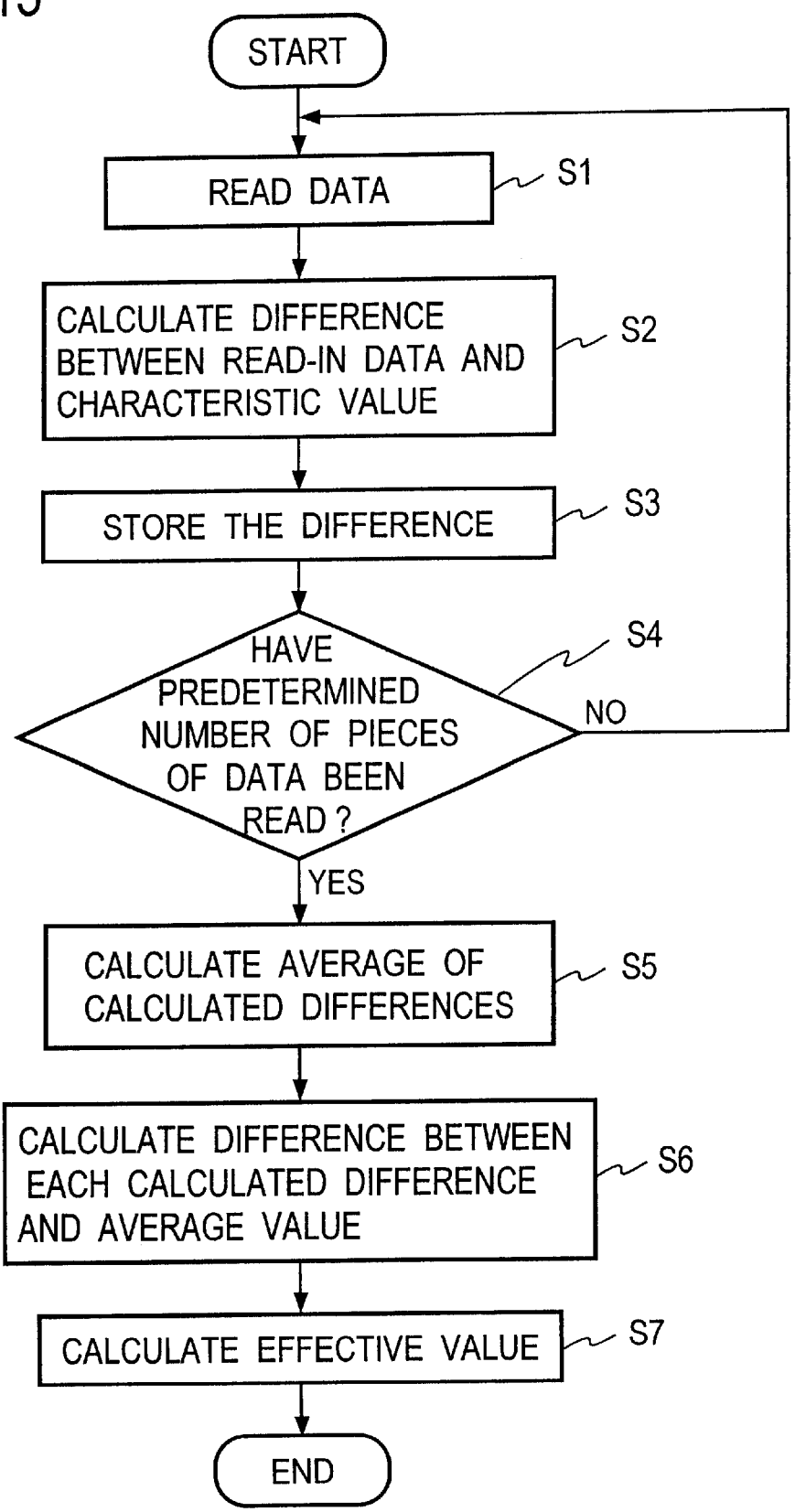
FIG. 13 is a flowchart showing an example of the procedure of jitter detecting mean 46 in FIGS. 5 and 11.

The jitter detecting means 46 follows such a procedure as depicted in FIG. 13. The jitter detecting means 46 first reads therein the pieces of digital data fed from the data select means 48 or the pieces of digital data V(t) from the memory 25 (S1), then calculates the difference between V(t) and V'(t) (S2), and stores the calculated results J'(t) in storage means (S3), and if it is found that the jitter detecting means 46 has not read therein the predetermined number of pieces of data (S4), then it returns to step S1. Having read therein the predetermined number of pieces of data, the jitter detecting means 46 reads out the difference-calculated results J'(t) and calculates their mean value $J_m$ (S5), then calculates the difference J(t) between the mean value $J_m$ and each of the difference-calculated results (S6), and further calculates an effective value $J_{rms}$ from the calculated results J(t) (S7).

The jitter detecting means 46, the data select means 48 and the characteristic calculating means 49 may also be implemented by executing a program by a microcomputer or digital signal processor.

Figure 4:
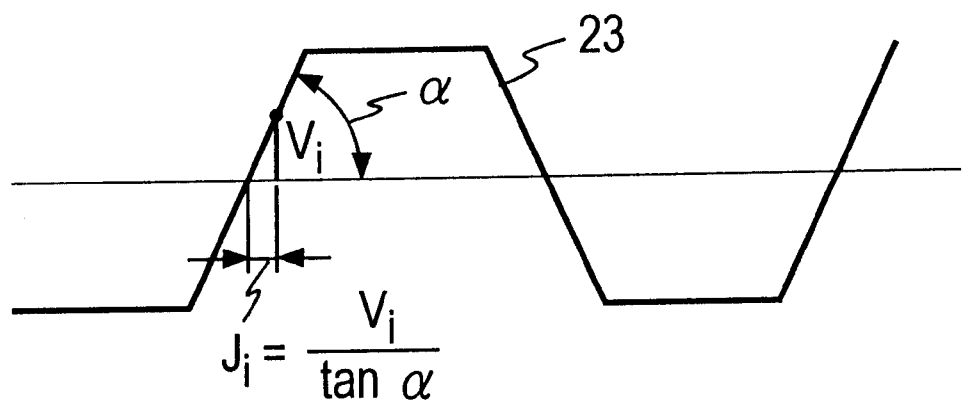
FIG. 4 is a diagram showing the relationships of a sampling value $V_i$, jitter $J_i$ and the leading edge of the signal to be measured.

In the above, the sampling points on the leading or trailing edge of the waveform-formatted output 30 are sequentially shifted by setting the frequency $f_C$ of the sample clock at a value slightly different from 1/N of the frequency $f_M$ of the signal to be measured 23, but it is also possible to sample the zero-crossing points of the average waveform-formatted output 30 by the waveform formatter 41 that is inserted between the device under measurement 11 and the sampling circuit 14 as indicated by the broken line in FIG. 2. In such an instance, jitter is obtained by calculating $J_i=V_i/\tan \alpha$ from the sampled digital data value $V_i$ as shown in FIG. 4. The $\alpha$ is the gradient of the rise-up (or fall) characteristic line of the waveform-formatted output 30 from the waveform formatter 41, and the rise-up or fall characteristic need not be calculated for each signal to be measured. By sampling the zero-crossing points of the average waveform-formatted output 30 as in this example, it is possible to detect maximum detectable jitter within the range of the leading (or railing) edge of the waveform formatter output 30, but points off the zero-crossing points may also be sampled.

Figure 14:
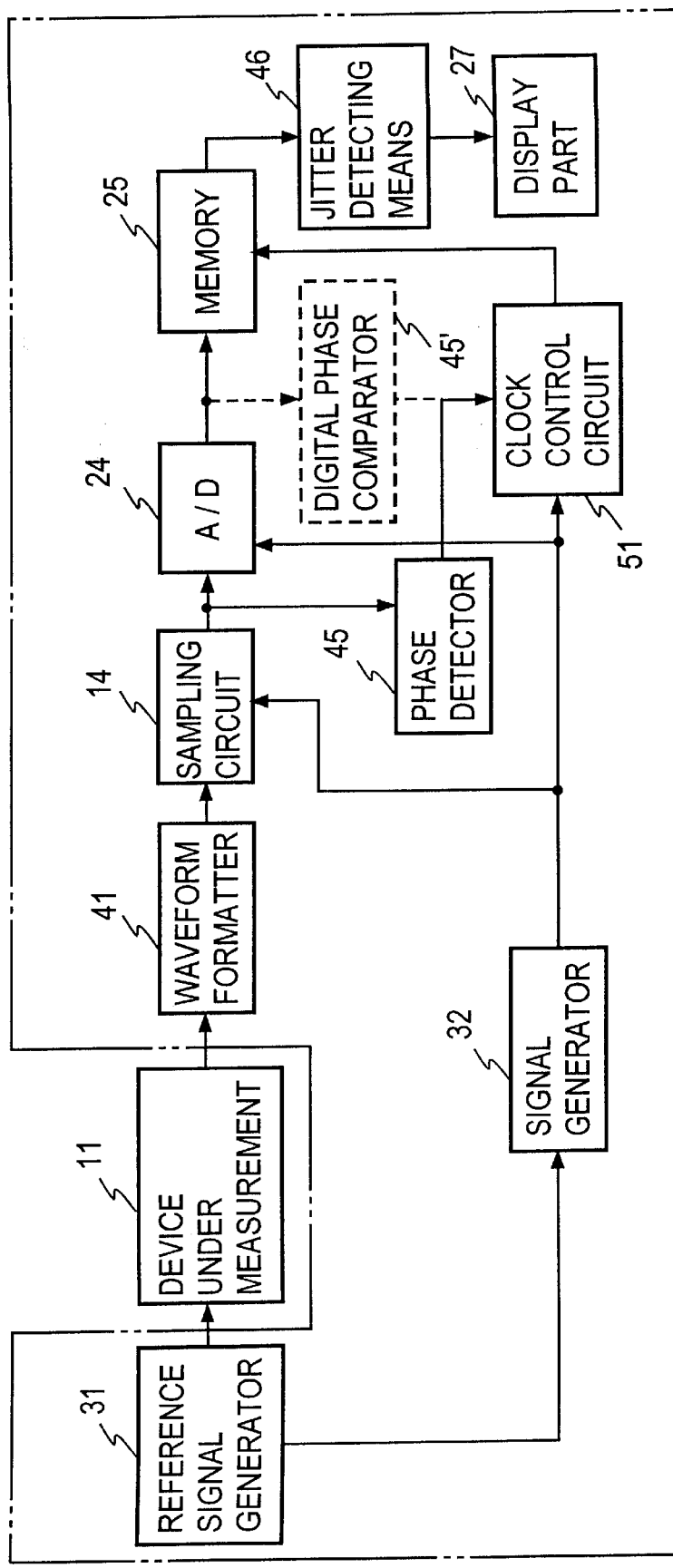
FIG. 14 is a block diagram illustrating the functional configuration of still another embodiment of the present invention.

The digital data may also be stored in the memory 25 in the way described below. As depicted in FIG. 14 in which the parts corresponding to hose in FIG. 5 re identified by the same reference numerals, the output samples from the sampling circuit 14 are always converted by the A/D converter 24 to digital form, and upon detecting the leading or trailing edge of the waveform formatter output 30 by the phase detector 45 in the manner described previously, a data storage clock control circuit 51 is controlled by the output from the phase detector 45 to permit the passage therethrough of the digital data from the A/D converter 24 for storage in the memory 25 only while the phase detector 45 provides the detected output, that is, while it is detected that the absolute value of the difference between the preceding and current sample values is in excess of the predetermined value. The data storage clock control circuit 51 has, for instance, a built-in address counter that counts sampling clocks from the signal generator 32 while it is supplied with the detected output from the phase detector 45. The count value of the address counter is provided as an address to the memory 25, and each time the address is stepped one stage, a write instruction is issued to the memory 25.

In the case where the output samples from the sampling circuit 14 are always converted by the A/D converter 24 to digital form as mentioned above, the phase detector 45 may be formed by a digital circuit as depicted in FIG. 14, in which a digital phase detector 45' is substituted for the phase detector 45 as indicated by the broken likes and is supplied with the output digital data from the A/D converter 24. Since the processing is digital processing in this case, the circuit design becomes easy.

The data storage clock control circuit 51 and the digital phase detector 45' are applicable as well to the FIG. 2 embodiment that uses the waveform formatter 41.

Provision may be made to change the rise-up or fall characteristic of the waveform-formatted output from the waveform formatter 41 to provide a particular type of characteristic fit for each intended use. This can be achieved by selectively using a plurality of waveform formatters whose outputs have different rise-up or fall characteristics. Since the comparator 44 is configured to produce a high- or low-level output due to a constant-current charge or discharge of an output capacitor when the input voltage level crosses the reference voltage level, it is also possible to change the rise-up or fall characteristic of the waveform-formatted output 30 by adjusting the resistance value of the constant-current source to change the value of the constant-current charge or discharge, or by selecting the capacity of the output capacitor. An alternative is to adjust the output amplitude of the waveform formatter 41—this can be achieved by designing the amplifier 44 to change its gain. The jitter measuring device of the present invention can also be operated by selecting a desired one of combinations of plural rise-up or fall characteristics of the waveform-formatted output and plural waveform-formatted output amplitude values as described above.

In the above, when sampled digital data sequences of the sampled digital data for use by the jitter detecting means 46 are arranged in terms of the afore-mentioned Δt, an output corresponding to the waveform of one leading or trailing edge of the waveform-formatted output is obtained, but provision may be made to obtain a plurality of such outputs corresponding to the waveform of the leading or trailing edge of the formatted output, that is, a larger number of pieces of sampled digital data may also be used to obtain jitter.

As referred to previously, the present invention is applicable as well to the test of semiconductor integrated circuits. In such an instance, the part 60 surrounded by the two-dot chain line is a semiconductor IC tester and the device under measurement 11 is a semiconductor IC. And jitter in a clock signal or logic signal from the IC under test 11 is measured. As is the case with the embodiments of FIGS. 2, 11 and 14, the function of measuring jitter in the output from the IC under test 11 can be included in functions of the IC tester 60.

As described above, the jitter measuring device of present invention does not use the PLL circuit and the harmonic suppression filter that must be designed for each different signal to be measured, and hence it is easy to fabricate. Moreover, since the rise-up or fall characteristic of each signal to be measured need not be calculated, the jitter measuring time can be reduced accordingly.

It will be apparent that many modifications and variations may be effected without departing from the scope of the novel concepts of the present invention.

What is claimed is:

1. A jitter measuring device comprising:
    a waveform formatter for formatting the waveform of a signal to be measured;
    a signal generator for generating a sampling clock;
    a sampling circuit for sampling the output from said waveform formatter by said sampling clock; and
    a jitter detecting part for detecting jitter from a deviation of the output of said sampling circuit from one of rise-up and fall characteristics of the output from said waveform formatter.

2. The device of claim 1, wherein: said signal generator generates a sampling clock of a frequency slightly different from a frequency that is an integral fraction of an average frequency of said signal to be measured; and said jitter detecting part detects jitter by calculating the difference between the output from said sampling circuit and said rise-up or fall characteristic.

3. The device of claim 2, which further comprises:
    an A/D converter for converting the output from said sampling circuit to digital data;
    a memory for storing the digital data converted by said A/D converter;
    a phase detector for detecting either one of leading and trailing edges of the output from said waveform formatter from the level of the output from said sampling circuit; and
    a sampling clock control circuit responsive to the detected output from said phase detector to control said A/D converter to start the conversion of the output from said sampling circuit.

4. The device of claim 2, which further comprises:
    an A/D converter for converting the output from said sampling circuit to digital data;
    a memory for storing the digital data converted by said A/D converter; and
    a data select part for selecting, from the output digital data of said A/D converter, digital data corresponding to either one of the leading and trailing edges of the output from the waveform formatter and for providing the selected digital data to said jitter detecting part.

5. The device of claim 3, which further comprises:
    an A/D converter for converting the output from said sampling circuit to digital data;
    a memory for storing the digital data converted by said A/D converter; and
    a data select part for reading out the digital data from said memory, for selecting, by digital processing, digital data corresponding either one of the leading and trailing edges of the output from said waveform formatter, and for providing the selected digital data to said jitter detecting part.

6. The device of claim 5, which further comprises a characteristic calculating part for calculating either one of the rise-up and fall characteristics of the output from said waveform formatter based on the digital data selected in said data selecting part and for providing the calculated characteristic to said jitter detecting part.

7. The device of claim 3, which further comprises a characteristic calculating part for calculating either one of the rise-up and fall characteristics of the output from said waveform formatter based on the digital data stored in said memory and for providing the calculated characteristic to said jitter detecting part.

8. The device of claim 1, wherein: said signal generator generates a sampling clock of a frequency equal to an integral fraction of an average frequency of said signal to be measured; and said jitter detecting part calculates jitter from the output from said sampling circuit and the gradient of either one of leading and trailing edges of the output from said waveform formatter.

9. The device of claim 8, which further comprises:
    a phase detector for detecting, from the level of the output from said sampling circuit, the state of sampling either one of the leading and trailing edges of the output from said waveform formatter substantially at the midpoint thereof; and
    a sampling clock control circuit responsive to the detected output from said phase detector to start the supply of the output from said sampling circuit to said jitter detecting part.

10. The device of claim 1, wherein said waveform formatter is a circuit that outputs a constant high- or low-level value, depending on whether the level of said signal to be measured goes up or down across a reference level.

11. The device of claim 10, wherein said waveform formatter comprises: a comparator supplied with said signal to be measured; and an amplifier for amplifying the output from said comparator.

12. A jitter measuring method comprising the steps of:
    waveform-formatting a signal to be measured;
    periodically sampling said waveform-formatted signal to obtain a sample sequence; and
    detecting jitter from said sample sequence and a rise-up or fall characteristic of said waveform-formatted signal.

13. The method of claim 12, wherein: the frequency of said sampling is set at a value slightly different from 1/N (where N is an integer equal to or greater than 1) of the frequency of said signal to be measured; and said jitter detecting step is a step of obtaining jitter by detecting a deviation of said sample sequence from either one of leading and trailing edges of said waveform-formatted signal.

14. The method of claim 13, which further comprises a step of detecting, by an approximate calculation, either one of the leading and trailing edges of said waveform-formatted signal from said sample sequence, said leading or trailing edge thus obtained being used to detect said deviation.

15. The method of claim 12, wherein: the frequency of said sampling is set at a value equal to 1/N (where N is an integer equal to or greater than 1) of the frequency of said signal to be measured; and said jitter detecting step is a step of obtaining jitter by detecting the position of each value of said sample sequence on said leading and trailing edges with reference to the zero-crossing point of said waveform-formatted signal.

16. A jitter measuring device comprising:

a waveform formatter for converting a periodic waveform output signal outputted from a device under measurement to a waveform-formatted signal;

a signal generator for generating a sampling clock;

a sampling circuit for sampling the waveform-formatted signal outputted from said waveform formatter by said sampling clock to thereby obtain a plurality of sampled data; and a jitter detecting part for detecting jitter from a deviation of the plurality of sampled data outputted from said sampling circuit from one of precalculated approximate rise-up and fall characteristics with substantially a least jitter outputted from said waveform formatter.

17. The device of claim 16, wherein:

said signal generator generates a sampling clock of a frequency slightly different from a frequency that is an integral fraction of an average frequency of said signal to be measured; and said jitter detecting part detects jitter by calculating the difference between the output from said sampling circuit and said rise-up or fall characteristic.

18. The device of claim 17, which further comprises:

an A/D converter for converting the output from said sampling circuit to digital data;

a memory for storing the digital data converted by said A/D converter;

a phase detector for generating a detection signal upon detecting either one of leading and trailing edges of the plurality of sampled data outputted from said waveform formatter from levels of the plurality of sampled data outputted from said sampling circuit; and a sampling clock control circuit responsive to the detection signal from said phase detector to control said A/D converter to start the conversion of the plurality of sampled data outputted from said sampling circuit.

19. The device of claim 17, which further comprises:

an A/D converter for sequentially converting the plurality of sampled data outputted from said sampling circuit to digital data;

a memory for storing the digital data converted by said A/D converter; and a data select part for selecting, from the output digital data of said A/D converter, digital data corresponding to either one of the leading and trailing edges of the plurality of sampled data outputted from the waveform formatter and for providing the selected digital data to said jitter detecting part.

20. The device of claim 17, which further comprises:

an A/D converter for converting the output from said sampling circuit to digital data;

a memory for storing the digital data converted by said A/D converter;

a phase detector for generating a detection signal upon detecting either one of leading and trailing edges of the plurality of sampled data outputted from said waveform formatter from levels of the plurality of sampled data outputted from said sampling circuit; and a data storage clock control circuit controlled by the detection signal outputted from the phase detector for allowing the sampling clocks form the signal generator to pass to the memory as an address signal for storing the output from the A/D converter.

21. The device of claim 18, which further comprises a characteristic calculating part for calculating either one of the rise-up and fall characteristics of the output from said waveform formatter based on the digital data selected in said data selecting part and for providing the calculated characteristic to said jitter detecting part.

22. The device of claim 19, which further comprises a characteristic calculating part for calculating either one of the rise-up and fall characteristics of the output from said waveform formatter based on the digital data selected in said data selecting part and for providing the calculated characteristic to said jitter detecting part.

23. The device of claim 16, wherein: said signal generator generates a sampling clock of a frequency equal to an integral fraction of an average frequency of said signal to be measured; and said jitter detecting part calculates jitter from the output from said sampling circuit and the gradient of either one of leading and trailing edges of the output from said waveform formatter.

24. The device of claim 23, which further comprises:

a phase detector for detecting, from the level of the output from said sampling circuit, the state of sampling either one of the leading and trailing edges of the output from said waveform formatter substantially at the midpoint thereof; and a sampling clock control circuit responsive to the detected output from said phase detector to start the supply of the output from said sampling circuit to said jitter detecting part.

25. The device of claim 16, wherein said waveform formatter is a circuit that outputs a constant high- or low-level value, depending on whether the level of said signal to be measured goes up or down across a reference level.

26. The device of claim 25, wherein said waveform formatter comprises: a comparator supplied with said signal to be measured; and an amplifier for amplifying the output from said comparator.

* * * * *